US009209265B2

(12) United States Patent
Tsai et al.

(10) Patent No.: US 9,209,265 B2
(45) Date of Patent: Dec. 8, 2015

(54) ESD DEVICES COMPRISING SEMICONDUCTOR FINS

(71) Applicant: Taiwan Semiconductor Manufacturing Company, Ltd., Hsin-Chu (TW)

(72) Inventors: Tsung-Che Tsai, Hsin-Chu (TW); Yi-Feng Chang, Xinbei (TW); Jam-Wem Lee, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 204 days.

(21) Appl. No.: 13/678,347

(22) Filed: Nov. 15, 2012

(65) Prior Publication Data
US 2014/0131765 A1 May 15, 2014

(51) Int. Cl.
| H01L 23/62 | (2006.01) |
| H01L 21/335 | (2006.01) |
| H01L 29/66 | (2006.01) |
| H01L 29/73 | (2006.01) |
| H01L 29/739 | (2006.01) |
| H01L 29/74 | (2006.01) |
| H01L 27/02 | (2006.01) |
| H01L 27/088 | (2006.01) |

(52) U.S. Cl.
CPC ...... *H01L 29/66363* (2013.01); *H01L 27/0255* (2013.01); *H01L 27/0262* (2013.01); *H01L 27/0886* (2013.01); *H01L 29/73* (2013.01); *H01L 29/7391* (2013.01); *H01L 29/7436* (2013.01)

(58) Field of Classification Search
CPC .............. H01L 29/66363; H01L 29/73; H01L 29/7436; H01L 27/0255; H01L 27/0262; H01L 27/0886; H01L 27/0248; H01L 27/0266; H01L 27/02388; H01P 29/7391
USPC ................. 257/173, 355, 328, 360, 506, 350, 257/E27.081; 361/56, 111; 438/142, 149, 438/152, 155
See application file for complete search history.

(56) References Cited

U.S. PATENT DOCUMENTS

| 2007/0221956 A1* | 9/2007 | Inaba ............................ 257/197 |
| 2008/0111163 A1* | 5/2008 | Russ et al. .................... 257/280 |
| 2008/0277729 A1* | 11/2008 | Gossner et al. ............... 257/360 |
| 2009/0035909 A1* | 2/2009 | Chang et al. .................. 438/276 |
| 2009/0283873 A1* | 11/2009 | Wang ............................ 257/647 |
| 2010/0025766 A1* | 2/2010 | Nuttinck et al. .............. 257/351 |
| 2010/0155776 A1* | 6/2010 | Lee ............................... 257/173 |
| 2010/0195364 A1* | 8/2010 | Riho .............................. 365/63 |
| 2010/0232077 A1* | 9/2010 | Worley .......................... 361/56 |

* cited by examiner

*Primary Examiner* — Galina Yushina
(74) *Attorney, Agent, or Firm* — Slater & Matsil, L.L.P.

(57) ABSTRACT

A device includes a semiconductor substrate, and an insulation region extending from a top surface of the semiconductor substrate into the semiconductor substrate. The device further includes a first node and a second node, and an Electro-Static Discharge (ESD) device coupled between the first node and the second node. The ESD device includes a semiconductor fin adjacent to and over a top surface of the insulation region. The ESD device is configured to, in response to an ESD transient on the first node, conduct a current from the first node to the second node.

20 Claims, 8 Drawing Sheets

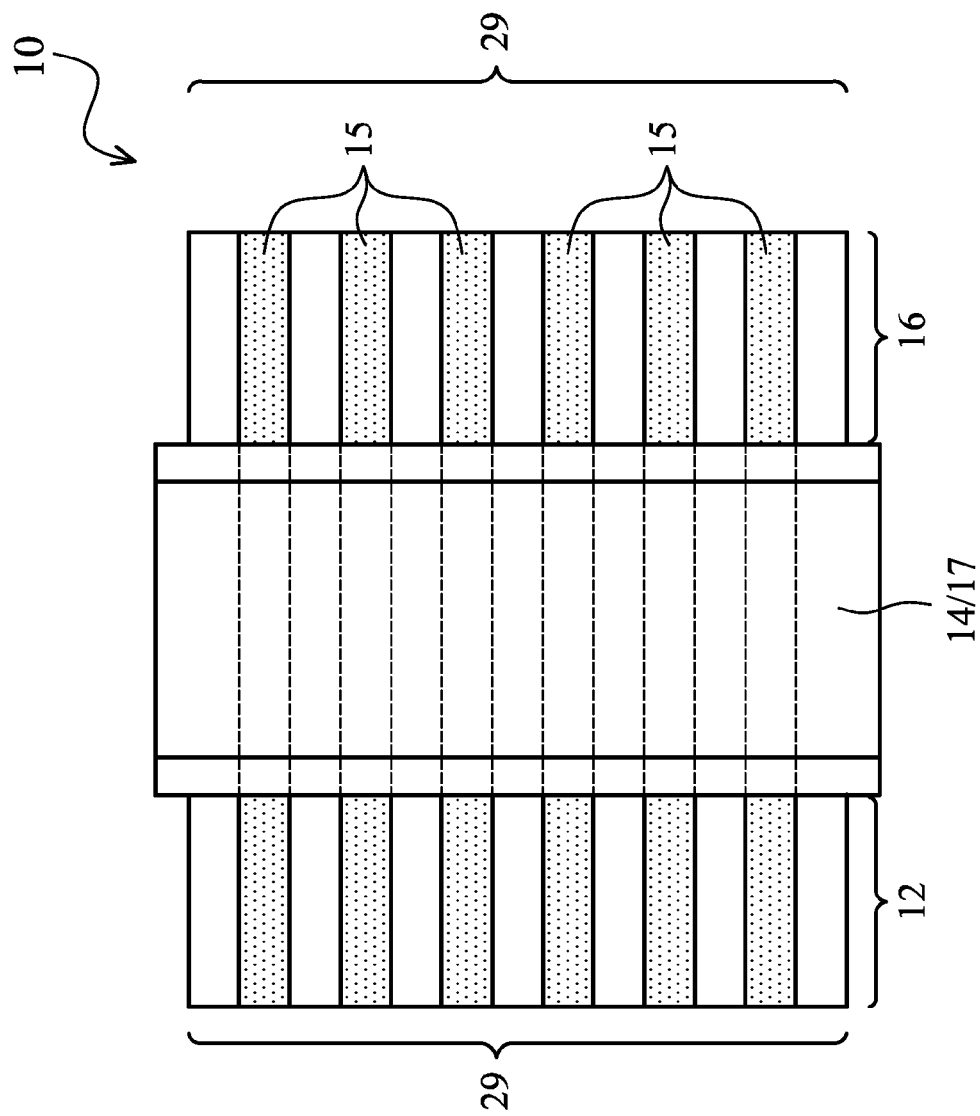

ESD DEVICES COMPRISING SEMICONDUCTOR FINS

BACKGROUND

It is well known that extremely high voltages can develop in the vicinity of an integrated circuit due to the build-up of static charges. A high potential may be generated to an input or output buffer of an integrated circuit, which may be caused by a person touching a package pin that is electrically connected to the input or output buffer. When the electrostatic charges are discharged, a high current is produced at the input and output nodes of the integrated circuit. Electro-Static Discharge (ESD) is a serious problem for semiconductor devices since it has the potential of destroying the entire integrated circuit.

The duration of the ESD transient is very short, typically in the order of nanoseconds, and the conventional circuit breakers cannot react quickly enough to provide adequate protection. For this reason, it has become a known practice to incorporate ESD devices in integrated circuits. When an ESD transient occurs, the ESD devices are turned on to conduct the ESD current to electrical ground, and hence the integrated circuits connected to the ESD devices are protected.

BRIEF DESCRIPTION OF THE DRAWINGS

For a more complete understanding of the embodiments, and the advantages thereof, reference is now made to the following descriptions taken in conjunction with the accompanying drawings, in which:

FIG. 4 illustrates a top view of a FinFET, which comprises a plurality of semiconductor fins therein;

DETAILED DESCRIPTION OF ILLUSTRATIVE EMBODIMENTS

Figure 1A:
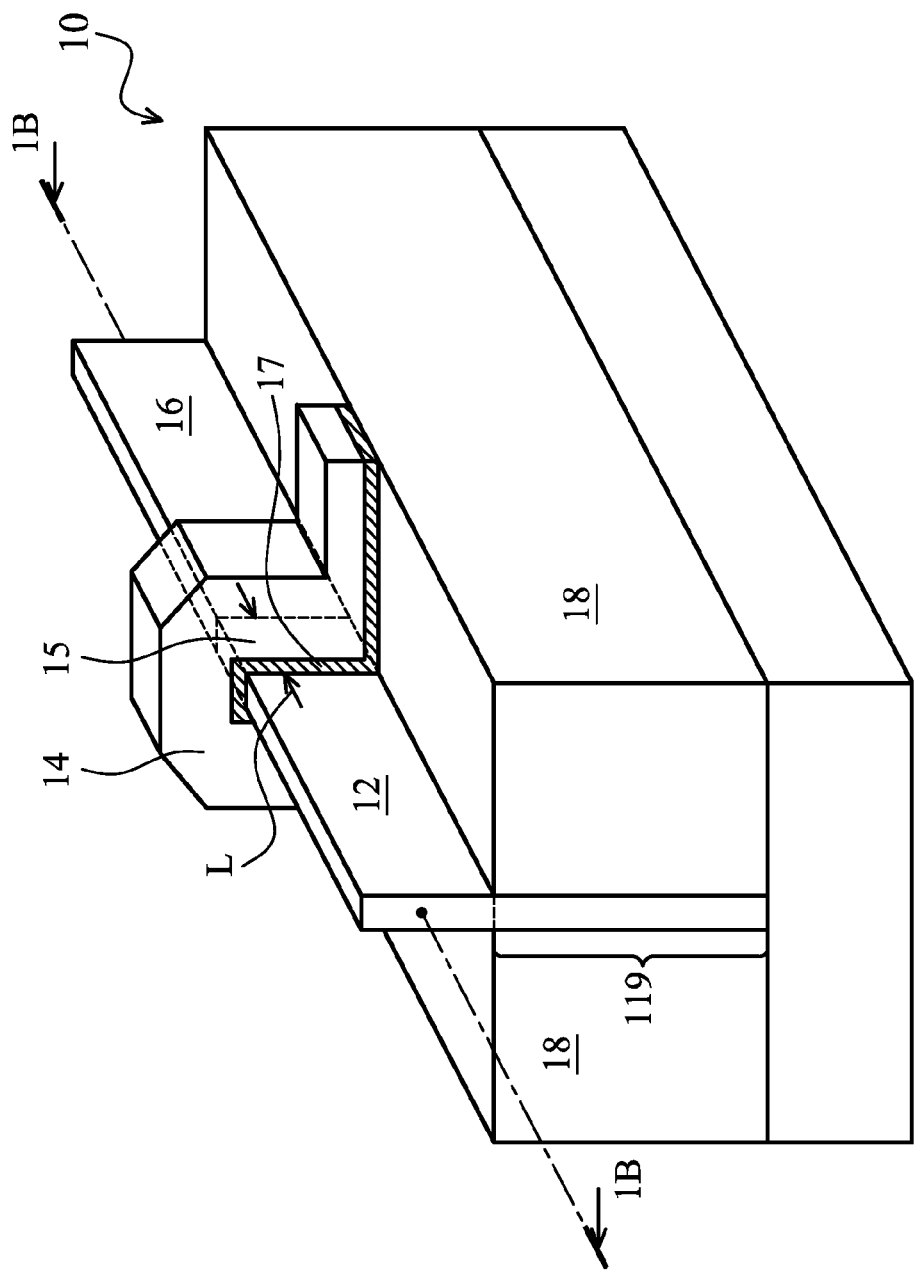
FIGS. 1A and 1B illustrate a perspective view and a cross-sectional view, respectively, of a Fin Field-Effect Transistor (FinFET) in accordance with some exemplary embodiments.

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

An Electro-Static Discharge (ESD) device based on semiconductor fins is provided in accordance with exemplary embodiments. The structure of the ESD device is discussed. The variations and the operation of the ESD device are also discussed. Throughout the various views and illustrated embodiments, like reference numerals are used to indicate like elements.

Figure 1B:
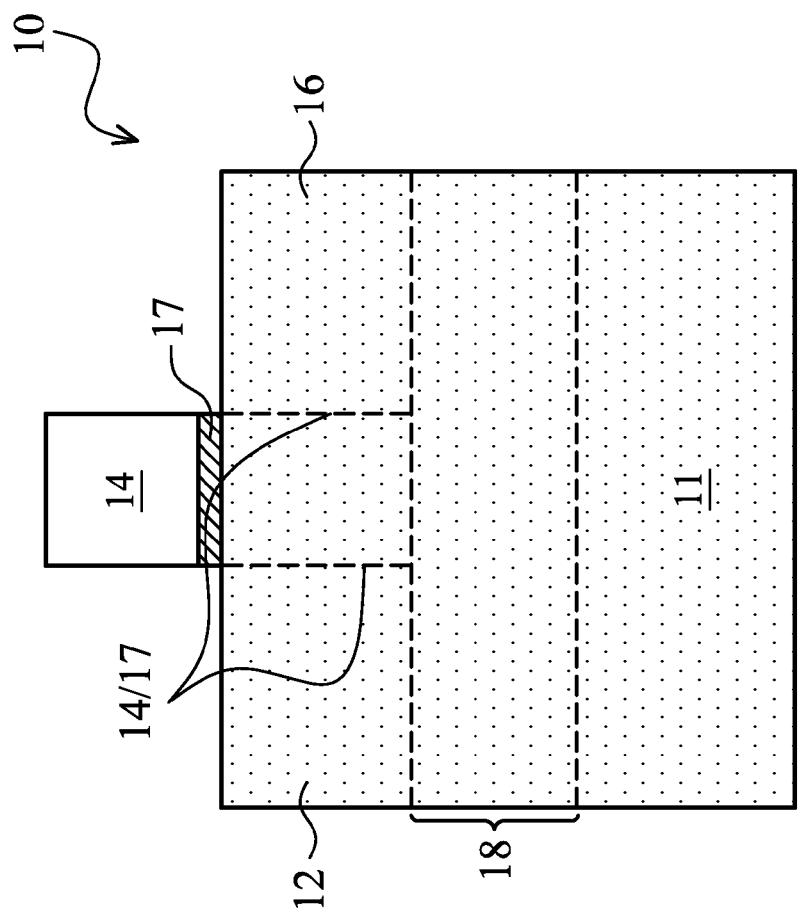
Figure 1C:
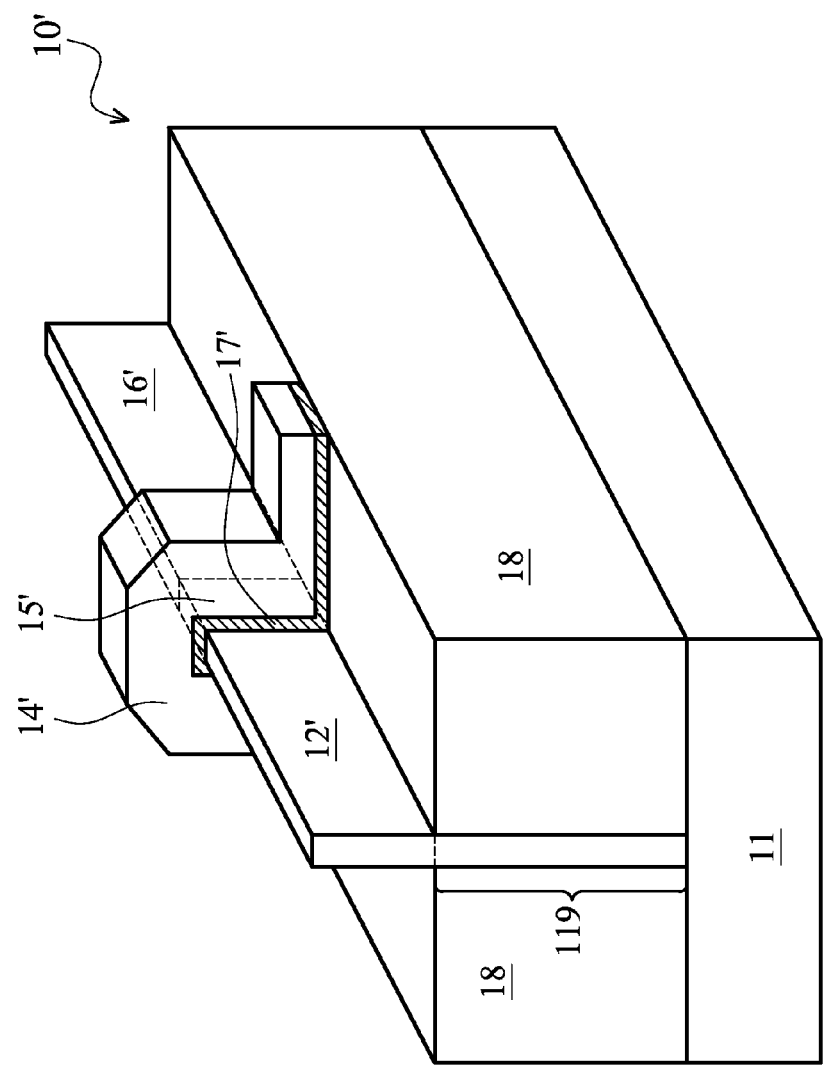
FIG. 1C illustrates a perspective view of a FinFET logic device in accordance with some exemplary embodiments.

FIGS. 1A and 1B illustrate a perspective view and a cross-sectional view, respectively, of Fin Field-Effect Transistor (FinFET) 10 in accordance with exemplary embodiments. FinFET 10 includes drain region 12, gate electrode 14, source region 16, gate dielectric 17, and fin 15 between drain region 12 and source region 16. Drain region 12 and source region 16 may be, or may not be, a portion of fin 15. Insulation regions 18 are formed on opposite sides of semiconductor strip 19, over which fin 15 is located. Fin 15 may be aligned to, and may be formed of a same material as, semiconductor strip 19. Isolation regions 18 may be Shallow Trench Isolation (STI) regions, although field oxide regions may be used. Gate dielectric 17 and gate electrode 14 comprise portions on the sidewalls and a top surface of fin 15. Accordingly, the channel between drain region 12 and source region 16 includes sidewall portions and the top surface portion of semiconductor fin 15.

In some embodiments, drain region 12 and source region 16 are also parts of the semiconductor fin 15, and are formed by implanting opposite end portions of fin 15. In alternative embodiments, drain region 12 and source region 16 are formed by etching opposite end portions of semiconductor fin 15 to form recesses, and then growing a semiconductor material from the recesses through epitaxy. Drain 12 and source region 16 may be n-type regions, and hence the resulting FinFET 10 is an n-type FinFET. Alternatively, Drain 12 and source region 16 are p-type regions, and hence the resulting FinFET 10 is a p-type FinFET.

FIG. 1B illustrates a cross-sectional view of the structure in FIG. 1A, wherein the cross-sectional view in FIG. 1B is obtained from the plane crossing line 1B-1B in FIG. 1A. In FIG. 1B, isolation regions 18 and some portions of gate dielectric 17 and gate electrode 14 are illustrated using dashed lines to indicate that these portions of features are not in the illustrated plane.

FinFET 10 has a high drive current since the sidewalls and the top surface of fin 15 may conduct current at the same time. In accordance with embodiments, FinFET 10 is used as an ESD device to discharge ESD currents. With the high drive current, FinFET 10 may conduct the ESD current quickly, and the likelihood of the damage to the circuits protected by FinFET 10 is reduced.

Figure 2:
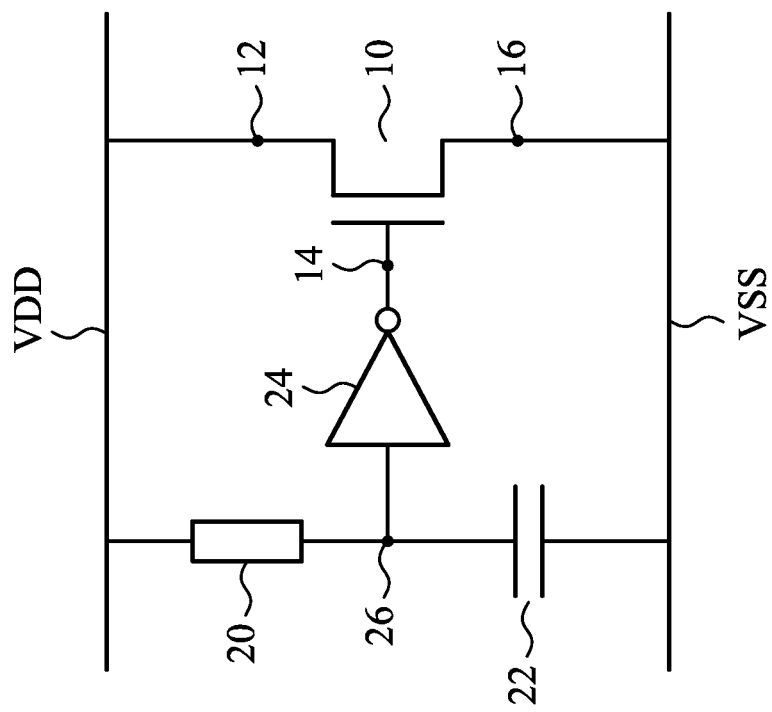
FIG. 2 illustrates an Electro-Static Discharge (ESD) protection circuit, in which the FinFET in FIGS. 1A and 1B is used as an ESD power clamp for discharging ESD currents.

ESD transient may occur on power supply nodes, or may occur on Input and Output (IO) nodes of circuits. FIG. 2 illustrates a circuit in which FinFET 10 is used as an ESD power clamp. In FIG. 2, resistor 20, capacitor 22, and inverter 24 form the trigger circuit for ESD device 10, wherein the trigger circuit is also referred to as an ESD detection circuit. Drain region 12 and source region 16 may be connected to positive power supply node VDD and voltage node VSS, respectively. Voltage node VSS may also be an electrical ground. The power supply voltage carried by positive power supply node VDD and voltage node VSS are also referred to as voltages VDD and VSS, respectively. The input of inverter 24 is coupled to a connecting node of resistor 20 and capacitor 22. The output of inverter 24 is coupled to gate 14 of ESD device 10.

When an ESD transient occurs on positive power supply node VDD, the voltage on node 26 is lowered to, for example, 0V. The gate voltage on gate 14 thus becomes a logic high voltage that is high enough to turn on ESD device 10. Accordingly, the ESD current flows through ESD device 10 and the transient ESD voltage is lowered. When no ESD transient occurs, however, the voltage on node 26 is equal to VDD, and the voltage on gate electrode 14 is low. ESD device 10 is hence turned off.

By using the trigger circuit in FIG. 2, the requirement to the thickness of gate dielectric 17 (FIG. 1A) is lowered, and gate dielectric 17 may use a thin dielectric as thin as a gate dielectric of a logic FinFET device, rather than a thick dielectric as thick as a gate dielectric of an IO device. Accordingly, ESD device 10 may be formed simultaneously as FinFET logic device 10', which is in the logic circuits that is on the same substrate 11 (FIG. 1B) as ESD device 10. In accordance with some exemplary embodiments, the FinFET logic device has a structure similar to that of ESD device 10, as illustrated in FIGS. 1A and 1B. Since ESD device 10 and FinFET logic device 10' are formed simultaneously, as aforementioned, gate dielectric 17 (FIGS. 1A and 1B) of ESD device 10 and gate dielectric 17' of FinFET logic device 10' have the same thickness. Similar to ESD device 10', FinFET logic device 10' includes drain region 12', gate electrode 14', source region 16', gate dielectric 17', and fin 15' between drain region 12' and source region 16'.

Figure 3:
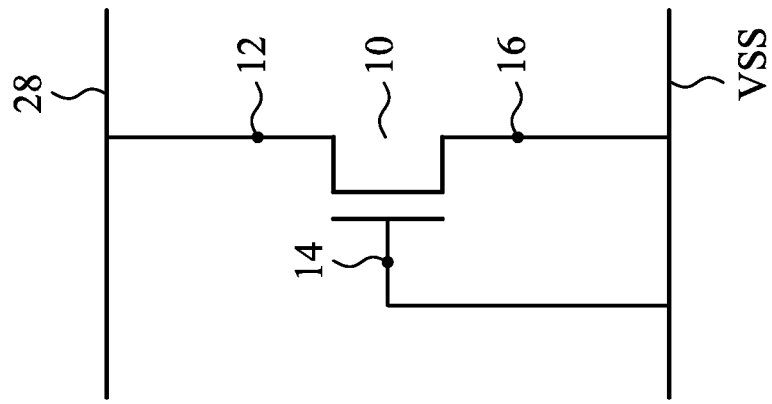
FIG. 3 illustrates an ESD protection circuit, in which the FinFET in FIGS. 1A and 1B is used for discharging ESD currents on an IO pad.

FIG. 3 illustrates the use of ESD device 10 in accordance with alternative embodiments. In these embodiments, gate 14 and source region 16 are connected to voltage node VSS, and drain region 12 is connected to node 28, which may be an IO pad or a voltage node. When an ESD transient occurs on node 28, the reverse-biased diode in ESD device 10 breaks down to conduct the ESD current.

In some exemplary embodiments, as shown in FIGS. 2 and 3, ESD devices 10 comprise n-type FinFETs. In alternative embodiments, p-type FinFETs may also be used as ESD devices. The connection of the p-type FinFETs may be realized by one of skilled in the art.

The ESD conducting ability of an ESD device is related to the total channel width of the respective ESD device. In accordance with embodiments, the total channel width may be increased by increasing the fin number of FinFET 10. For example, FIG. 4 illustrates a top view of FinFET 10 including a plurality of semiconductor fins 15, wherein gate dielectric 17 and gate electrode 14 cross over the center portions of semiconductor fins 15. Each of drain region 12 and source region 16 may include epitaxy regions 29 that are epitaxially grown from the source/drain portions of semiconductor fins 15. By using FinFETs as ESD devices, the ESD conducting ability of the ESD device 10 may be easily adjusted by selecting an appropriate number of semiconductor fins 15.

Figure 5:
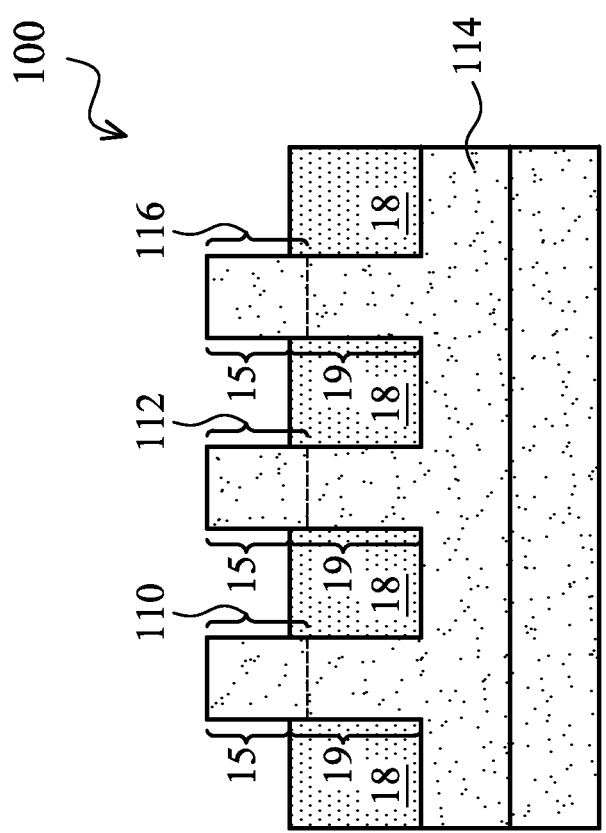
FIG. 5 illustrates a cross-sectional view of a bipolar transistor formed based on semiconductor fins.

FIG. 5 illustrates a fin-based ESD device, which comprises NPN bipolar transistor 100 formed based on semiconductor fins. Semiconductor fins 15 are formed over the top surfaces of STI regions 18. P-well region 114 is formed in semiconductor substrate 11, and may extend into semiconductor strips 19, and possibly into fins 15. Heavily doped n-type regions (N+) regions 110 and 112 are formed in semiconductor fins 15, and are spaced apart from each other by one of STI regions 18. Heavily doped p-type (P+) region 116 is formed in another semiconductor fin 15, and acts as the pickup region of p-well region 114. P-well region 114 forms the base of NPN bipolar transistor 100, and N+ regions 110 and 112 form a collector and an emitter of NPN bipolar transistor 100. A PNP fin-based bipolar transistor may also have a structure similar to the structure in FIG. 5, with the conductivity types of regions 110, 112, 114, and 116 inversed.

Figure 6:
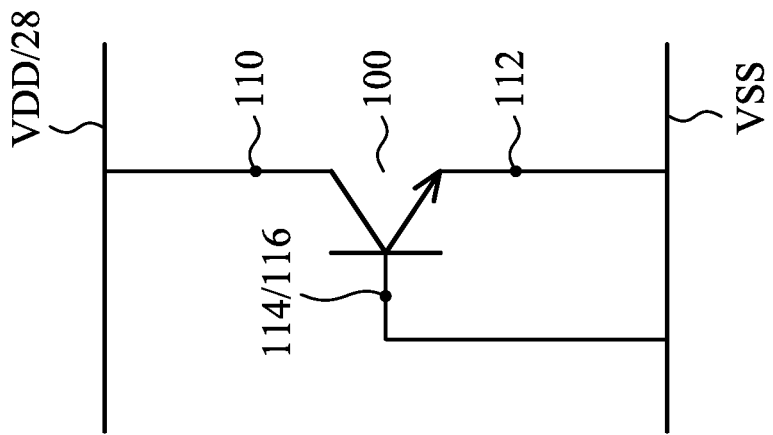
FIG. 6 illustrates a circuit in which the bipolar transistor is used for discharging ESD currents.

FIG. 6 illustrates using NPN bipolar transistor 100 as an ESD device, which is used to protect circuits from ESD transient on voltage node VDD or IO node 28, which node is referred to as VDD/28 throughout the description. Collector 110 is connected to node VDD/28, and emitter 112 is connected to voltage node VSS. Base 114/116 is also connected to voltage node VSS. When an ESD transient occurs on node VDD/28, the reverse-biased diode comprising base 114/116 and collector 110 breaks down to conduct the ESD current. It is realized that when a fin-based PNP bipolar transistor 100 is used as the ESD device, the base of the PNP bipolar transistor 100 may be connected to node VDD/28.

Figure 7:
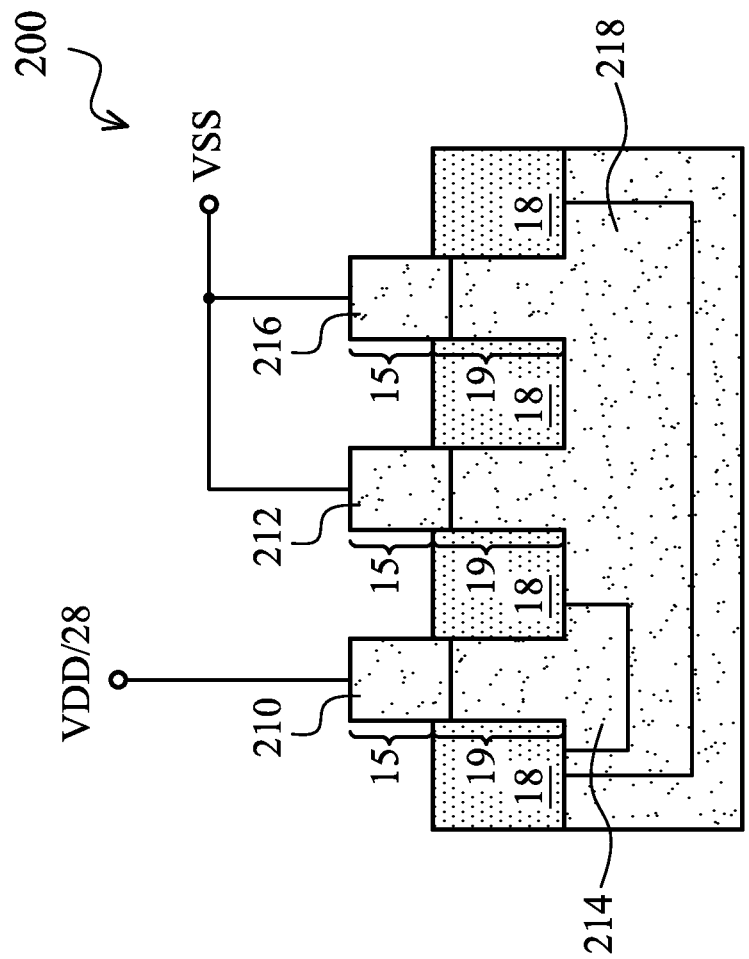
FIG. 7 illustrates a cross-sectional view of a silicon-controlled rectifier, which comprises semiconductor fins therein.

FIG. 7 illustrates fin-based Silicon-Controlled Rectifier (SCR) 200 used as an ESD device in accordance with exemplary embodiments. In these embodiments, SCR 200 includes n-well region 214 and p-well region 218. P+ region 210 is formed in one of semiconductor fins 15, and is formed over, and contacting, n-well region 214. N-well region 214 may extend into semiconductor strip 19, and possibly into fin 15. N+ region 212 and P+ region 216 may also be formed in semiconductor fins 15, and formed over, and contacting p-well region 218. P-well region 218 may also extend into semiconductor strip 19, and possibly into fins 15 in accordance with some embodiments. Accordingly, P+ region 210, n-well region 214, and p-well region 218 form a PNP transistor. N-well region 214, p-well region 218, and N+ region 212 for an NPN transistor. When used as an ESD device, in accordance with some exemplary embodiments, P+ region 210 may be connected to node VDD/28 (voltage node VDD or IO node 28), and N+ region 212 and P+ region 216 may be connected to voltage node VSS. Accordingly, in these embodiments, SCR 200 is used as an ESD power clamp or an IO ESD protection device.

Figure 8:
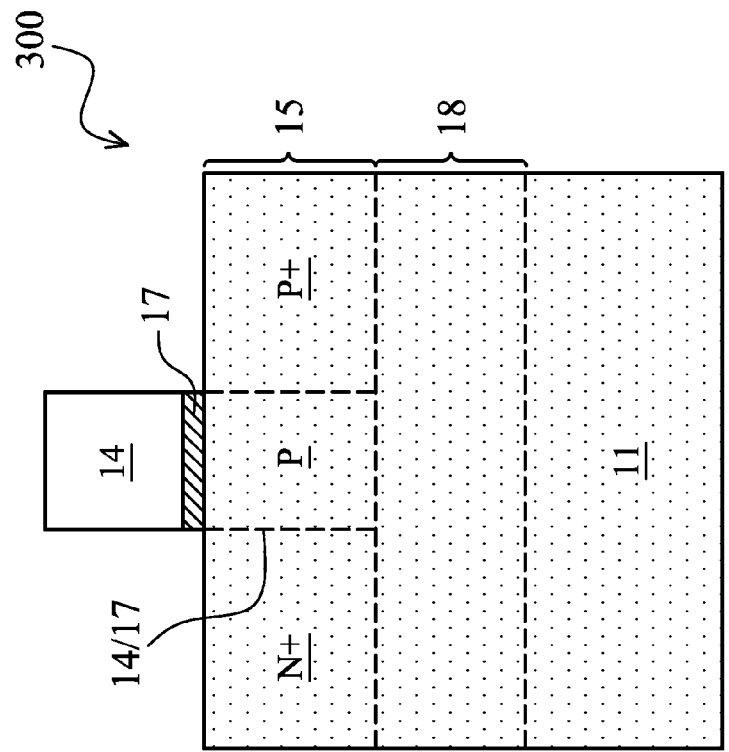
FIG. 8 illustrates a cross-sectional view of a diode, which comprises semiconductor fins therein.

FIG. 8 illustrates a cross-sectional view of fin-based diode 300, which includes gate dielectric 17 and gate electrode 14 formed on sidewalls and a top surface of fin 15. The opposite ends of fins 15 are doped to form a p-type (which may be P+) region and an n-type (which may be N+) region. The center portion of fin 15 that is under gate electrode 14 is of either p-type or n-type. In the illustrated embodiments, it is assumed that the center portion of fin 15 is p-type (although it may also be of n-type). Accordingly, the center portion of fin 15 and the P+ region form the anode of diode 300, and the N+ region forms the cathode of diode 300.

Figure 9:
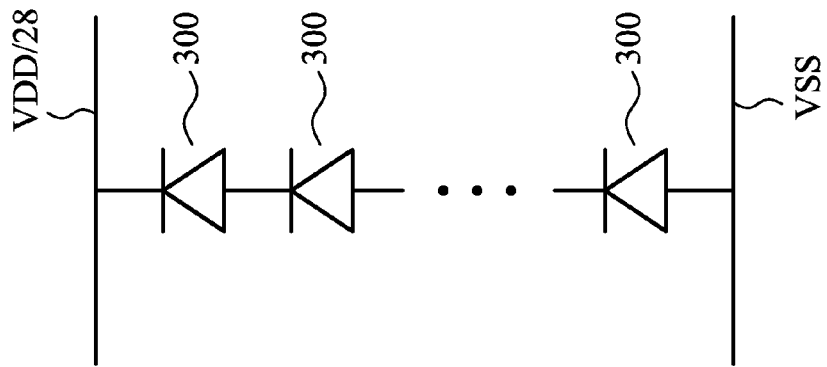
FIG. 9 illustrates a circuit in which a plurality of fin-based diodes is used for discharging ESD currents.

FIG. 9 illustrates an exemplary usage of fin-based diodes 300 as ESD devices, wherein diodes 300 are cascaded. Diodes 300 are connected in series between voltage node VDD (or IO node 28) and voltage VSS. The number of diodes 300 is selected depending on the desirable breakdown voltage that causes diodes 300 to breakdown.

In the embodiments, fin-based devices including FinFETs, bipolar transistors, SCRs, diodes, or the like, are used to form ESD devices. As a result, the current-conducting ability of the ESD devices is improved over that of planar ESD devices. Furthermore, the manufacturing processes of the fin-based ESD devices are compatible with the formation of logic FinFET ESD devices, and hence no extra manufacturing cost is involved.

In accordance with embodiments, a device includes a semiconductor substrate, and an insulation region extending from a top surface of the semiconductor substrate into the semiconductor substrate. The device further includes a first node and a second node, and an ESD device coupled between the first node and the second node. The ESD device includes a semiconductor fin adjacent to and over a top surface of the insulation region. The ESD device is configured to, in response to an ESD transient on the first node, conduct a current from the first node to the second node.

In accordance with other embodiments, a device includes a semiconductor substrate, and an insulation region extending from a top surface of the semiconductor substrate into the semiconductor substrate. The device further includes a first node and a second node, and a FinFET. The FinFET includes a semiconductor fin over a top surface of the insulation region, a gate dielectric on sidewalls and a top surface of the semiconductor fin, a gate electrode over the gate dielectric, and a source region and a drain region on opposite sides of the gate electrode. A first one of the source region and the drain region is coupled to the first node, and a second one of the source region and the drain region is coupled to the second node. The FinFET is configured to, in response to an ESD transient on the first node, conduct a current from the first node to the second node.

In accordance with yet other embodiments, a method includes, in response to an ESD transient on a first node of a circuit, turning on a fin-based ESD device to conduct an ESD current from the first node to a second node, wherein the fin-based ESD device comprises a semiconductor fin. The method further includes, in response to no ESD transient occurring on the first node of the circuit, turning off the fin-based ESD device. The Fin-based ESD device includes a semiconductor fin over a top surface of an insulation region, which extends from a top surface of a substrate into the semiconductor substrate.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a semiconductor substrate;
an insulation region extending from a top surface of the semiconductor substrate into the semiconductor substrate;
a first node and a second node; and
an Electro-Static Discharge (ESD) device coupled between the first node and the second node, wherein the ESD device comprises a first Fin Field-Effect Transistor (FinFET) comprising:
a first semiconductor fin adjacent to and over a top surface of the insulation region;
a first gate dielectric on sidewalls and a top surface of the first semiconductor fin, wherein the ESD device is configured to, in response to an ESD transient on the first node, conduct a current from the first node to the second node; and
a second FinFET as a logic device, wherein the second FinFET comprises:
a second semiconductor fin over the semiconductor substrate; and
a second gate dielectric on sidewalls and a top surface of the second semiconductor fin, wherein the first gate dielectric and the second gate dielectric have a same thickness.

2. The device of claim 1, wherein the first FinFET further comprises
a gate electrode over the gate dielectric; and
a source region and a drain region on opposite sides of the gate electrode.

3. The device of claim 2 further comprising:
a resistor comprising a first end coupled to the first node;
a capacitor coupled between the second node and a second end of the resistor; and
an inverter comprising an input coupled to the second end of the resistor, and an output coupled to the gate electrode of the FinFET, wherein a first one of the source region and the drain region is coupled to the first node, and a second one of the source region and the drain region is coupled to the second node.

4. The device of claim 2, wherein the gate electrode is further connected to one of the first node and the second node.

5. The device of claim 1, wherein the first FinFET is an n-type FinFET.

6. The device of claim 1, wherein the first FinFET is a p-type FinFET.

7. A device comprising:
a semiconductor substrate;
an insulation region extending from a top surface of the semiconductor substrate into the semiconductor substrate;
a first node and a second node; and
a Fin Field-Effect Transistor (FinFET) comprising:
a semiconductor fin over a top surface of the insulation region;
a gate dielectric on sidewalls and a top surface of the semiconductor fin;
a gate electrode over the gate dielectric;
a source region and a drain region on opposite sides of the gate electrode, wherein a first one of the source region and the drain region is coupled to the first node, and a second one of the source region and the drain region is coupled to the second node, and wherein the FinFET is configured to, in response to an ESD transient on the first node, conduct a current from the first node to the second node; and
a logic FinFET comprising:
an additional semiconductor fin; and
an additional gate dielectric on sidewalls and a top surface of the additional semiconductor fin, wherein the gate dielectric and the additional gate dielectric have a same thickness.

8. The device of claim 7, wherein the FinFET comprises a plurality of semiconductor fins over the top surface of the insulation region, and wherein the gate dielectric and the gate electrode extend on opposite sidewalls and a top surface of each of the plurality of semiconductor fins.

9. The device of claim 7 further comprising:
a resistor comprising a first end coupled to the first node;
a capacitor coupled between a second end of the resistor and the second node; and
an inverter comprising an input coupled to the second end of the resistor, and an output coupled to the gate electrode of the FinFET.

10. The device of claim 7, wherein the gate electrode is further connected to one of the first node and the second node.

11. The device of claim 7, further comprising:
an additional insulation region extending from a top surface of the semiconductor substrate into the semiconductor substrate; and
a semiconductor strip between, and in contact with, the insulation region and the additional insulation region, wherein the semiconductor strip is aligned to the semiconductor fin.

12. The device of claim 7, wherein the FinFET comprises a plurality of semiconductor fins parallel to the semiconductor fin, with the gate dielectric and the gate electrode extending over the plurality of semiconductor fins.

13. The device of claim 7, wherein the FinFET is an n-type FinFET.

14. The device of claim 7, wherein the FinFET is a p-type FinFET.

15. A method comprising:
in response to an Electro-Static Discharge (ESD) transient on a first node of a circuit, turning on a fin-based ESD device to conduct an ESD current from the first node to a second node, wherein the fin-based ESD device comprises a Fin Field-Effect Transistor (FinFET) comprising:
a semiconductor fin; and
a gate dielectric on a top surface and sidewalls of the semiconductor fin, with the gate dielectric having a same thickness as a thickness of a gate dielectric in a logic FinFET formed on a same semiconductor substrate as the FinFET; and
in response to no ESD transient occurring on the first node of the circuit, turning off the fin-based ESD device.

16. The method of claim 15, wherein the semiconductor fin forms a channel region of the FinFET, and wherein the ESD current is conducted through the FinFET.

17. The method of claim 15, wherein conducting the ESD current from the first node to the second node comprises conducting the ESD current from a first power supply node to a second power supply node.

18. The method of claim 15, wherein conducting the ESD current from the first node to the second node comprises conducting the ESD current from an input/output node to an electrical ground.

19. The method of claim 15, wherein the FinFET is an n-type FinFET.

20. The method of claim 15, wherein the FinFET is a p-type FinFET.

* * * * *